(12) United States Patent
Lee

(10) Patent No.: US 7,754,520 B2
(45) Date of Patent: Jul. 13, 2010

(54) DONOR FILM AND METHODS FOR FABRICATING PATTERNED ORGANIC ELECTROLUMINESCENT DEVICES USING THE SAME

(75) Inventor: Tae-Woo Lee, Seoul (KR)

(73) Assignee: Samsung Mobil Display Co., Ltd., Yongin, Gyunggi-Do (KR)

( * ) Notice: Subject to any disclaimer, the term of this patent is extended or adjusted under 35 U.S.C. 154(b) by 1194 days.

(21) Appl. No.: 11/347,659

(22) Filed: Feb. 6, 2006

(65) Prior Publication Data
US 2006/0188697 A1 Aug. 24, 2006

(30) Foreign Application Priority Data
Feb. 4, 2005 (KR) .................. 10-2005-0010616

(51) Int. Cl.
*H01L 21/00* (2006.01)
(52) U.S. Cl. ..................... 438/82; 438/99; 257/40; 257/E51.022
(58) Field of Classification Search ............. 438/82, 438/83, 99, 149–167; 257/40, E51.022
See application file for complete search history.

(56) References Cited

U.S. PATENT DOCUMENTS 5,937,272 A 8/1999 Tang

2004/0121568 A1* 6/2004 Kim et al. .................. 438/584
2004/0191564 A1 9/2004 Kim et al.

FOREIGN PATENT DOCUMENTS

KR 1020030073578 9/2003

OTHER PUBLICATIONS

An article "Patterning organic light-emitting diodes by cathode transfer" written by Rhee, et al. published in American Institute of Physics, vol. 81 No. 22 on Nov. 25, 2002.
An article "Micropatterning of Organic Electronic Devices by Cold-Welding" written by Kim, et al., published in Science, vol. 288 on May 5, 2000.
*Office Action* from the Chinese Patent Office issued in Applicant's corresponding Chinese Patent Application No. 2006100045578 dated Aug. 8, 2008.

* cited by examiner

*Primary Examiner*—Brook Kebede
(74) *Attorney, Agent, or Firm*—Robert E. Bushnell, Esq.

(57) ABSTRACT

A donor film has a soft polymer film and a transfer layer to be transferred which is formed on the soft polymer film. When fabricating a patterned organic electroluminescent device using the donor film for thin film transfer, the transfer layer is transferred even with a small amount of energy due to good adhesion between the transfer layer of the donor film and an acceptor film, and multiple layers, such as organic small molecular and polymer layers in addition to a metal layer, may be simultaneously transferred, while eliminating a need of a photothermal conversion layer.

22 Claims, 6 Drawing Sheets

(a)

(b)

(c)

(a)

(b)

(c)

(a)

(b)

(c)

(d)

(a)

(b)

(c)

DONOR FILM AND METHODS FOR FABRICATING PATTERNED ORGANIC ELECTROLUMINESCENT DEVICES USING THE SAME

CROSS-REFERENCE TO RELATED PATENT APPLICATION AND CLAIM OF PRIORITY

This application claims the benefit of Korean Patent Application No. 10-2005-0010616, filed on Feb. 4, 2005, in the Korean Intellectual Property Office, the disclosure of which is incorporated herein in its entirety by reference.

BACKGROUND OF THE INVENTION

1. Field of the Invention

The present invention relates to a donor film and methods for fabricating patterned organic electroluminescent devices using the donor film, and more particularly to methods for fabricating patterned organic electroluminescent devices using a donor film for thin film transfer, in which at least one of an organic layer and a metal layer are transferred from an upper donor layer to a lower acceptor layer by at least one of light, heat, electric energy and pressure, the donor film containing a soft polymer film layer having a glass transition temperature of not greater room temperature.

2. Description of the Related Art

An organic electroluminescent (EL) device is a self-emission display using a phenomenon in which, when a current is applied to a fluorescent or phosphorescent organic compound film, light is emitted from the organic compound film by electron-hole recombination occurring. The organic EL device is lightweight, has non-complex components, and has a simplified manufacturing process. Furthermore, the organic EL device exhibits a high image quality and a wide viewing angle. Also, the organic EL device can present dynamic images and can achieve high color purity. In addition, the organic EL device has advantageous electrical features suitable for portable electronic devices, such as lower power consumption or lower voltage driving. The organic EL device can be used in various fields, including displays in electronic devices, backlight units, and so on.

Generally, the organic EL devices have a sequentially stacked structure of an anode, an organic layer including a hole transport layer, a light-emitting layer and an electron transport layer, and a cathode. In order to achieve more efficient injection of holes and electrons, a hole injection layer may further be provided between the anode and the hole transport layer, and an electron injection layer may further be provided between the electron transport layer and the cathode.

Here, the holes injected from the anode migrate to the light-emitting layer via the hole injection layer and the hole transport layer, and electrons from the cathode are injected into the light-emitting layer via the electron injection layer and the electron transport layer. The electrons and holes are recombined at the light-emitting layer to generate excitons. The generated excitons cause the light-emitting layer to emit light corresponding to an energy gap of the excitons deactivated from an excited state to a ground state, thus forming an image.

The anode is made of transparent conductive material having a high work function, such as ITO, IZO, or ITZO, and the cathode is made of a metallic material having a low work function and being chemically stable.

A passive matrix type organic EL device, which is one of organic EL devices, comprises an anode, a cathode, and a multi-layered organic layer interposed therebetween, and emits light at an intersection of the anode and the cathode when a current is applied between the anode and the cathode. Here, the anode is formed on the top of the organic layer in a predetermined pattern.

Meanwhile, in order to attain full-color organic EL devices, it is necessary to micro-pattern the organic layer including the light-emitting layer, the electron transport layer, and the hole transport layer.

One approach for micro-patterning the organic layer is a lithography technique. In the lithography technique, an organic layer is coated with photoresist, exposed and developed to obtain a photoresist pattern, and the obtained photoresist pattern is used in micro-patterning the organic layer. According to this approach, since the organic layer is liable to deform due to an organic solvent used during the process or developer residues, it is substantially impossible to put into practice. Another approach is a vacuum deposition method using a mask, which is, however, disadvantageous in that micro-patterning is difficult to achieve.

U.S. Pat. No. 5,937,272 discloses a method of forming an advanced patterned organic layer in a full color organic electroluminescent display device, wherein a donor support is coated with a transferable coating of an organic EL material. The donor support is heated to cause the transfer of the organic EL material onto the designated recessed surface portions of the substrate forming the colored EL medium in the designated subpixels. Optical masks and, alternatively, an aperture mask are used to selectively vapor deposit respective red, green, and blue organic EL media into the designated color EL subpixels. This method is similar to a thermal deposition technique in which an organic material is heated under vacuum and deposited through a shadow mask.

Another method is a laser induced thermal imaging process. In order to apply the laser induced thermal imaging process, a light source, a transfer film and a substrate are needed, and light coming out of the light source is absorbed by a photothermal conversion layer of the transfer film to be converted into heat energy so that a transfer layer forming material of the transfer film is transferred onto the substrate by heat energy to form a desired image.

Since it is necessary to convert laser induced light into heat energy, the photothermal conversion layer is made of a high thermal conversion capability, e.g., organic compounds such as carbon black or IR-pigments, metallic materials such as aluminum, oxides of the metallic materials, or mixtures of these materials.

U.S. Patent Published Application No. 2004-0191564 discloses a donor film of a low molecular weight full color organic electroluminescent display device, the donor film comprising: a substrate film; a photothermal conversion layer formed on the upper part of the substrate film; and a transfer layer formed on an upper part of the photothermal conversion layer and formed of a material comprising a low molecular weight material, wherein a part of the transfer layer which is irradiated and heated by a laser is separated from the photothermal conversion layer according to change of an adhesion force of the transfer layer with the photothermal conversion layer, wherein a part of the transfer layer which is not irradiated by the laser is fixed to the photothermal conversion layer by an adhesion force of the transfer layer with the photothermal conversion layer, and an adhesion force between a substrate of an organic electroluminescent display device to which the material comprising low molecular weight material formed on the transfer layer is transferred and the material comprising low molecular weight material and an adhesion force between the photothermal conversion layer and the material comprising low molecular weight material are greater than an adhesive force between the material comprising low molecular weight material of a laser irradiated region in the transfer layer and the material comprising low molecular weight material of a laser non-irradiated region, so that the material comprising the low molecular weight material of the laser irradiated region and the material comprising the low molecular weight material of the laser non-irradiated region are separated with respect to each other to cause mass transfer from the photothermal conversion layer to the substrate.

However, in the case where a pattern is transferred using the laser induced thermal imaging (LITI) method, since a donor film has poor flexibility and poor adhesion between the donor film and a lower acceptor film, a large amount of energy is required. In addition, since only organic materials are transferable, it is necessary to separately deposit a metal after patterning an organic layer to fabricate a passive matrix type organic EL device, which is quite burdensome. Further, this process requires a photothermal conversion layer.

According to a cold-welding method developed by Kim et. al. [Science, vol 288, p 831 (2000)], a desired portion of a metal layer coated on a substrate is stamped using a metal-metal adhesive force, and then removed. That is, organic layers are stacked on a substrate, and a cathode layer is deposited over the entire surface of the resulting structure. A stamp having a metal layer deposited thereon is pressed onto the cathode layer by applying a sufficient pressure thereto, and then the stamp is removed, thereby forming a cathode pattern.

In this case, however, since a large amount of pressure and a metal-metal adhesive force are used, this method is restrictively applied to metals having a high work function, or alloys of these metals, such as Au—Au, Ag—Ag, Pd—Pd. In addition, since this method is a lift-off method, rather than a transfer method, it is used only for patterning purposes after fabrication of a device.

Rhee and Lee developed a cathode transfer method, as disclosed in [Applied Physics Letters, vol. 81, p 4165, (2002)], including transferring pretreated and prepatterned metal on a substrate onto the surface of organic layers of the device by pressing, utilizing a difference in the adhesion strength of the metal between the substrate and the underlying organic layer. In this case, however, since sufficiently large amount of pressure is used and glass mold is used, the organic layer may be physically damaged and a release promotion layer is essentially needed.

Patterning methods such as micro contact printing, micro molding, nano transfer printing and so on use polydimethylsiloxane (PDMS), which is a kind of elastomeric silicone-based rubber and has a low glass transition temperature.

Korean Patent Publication No. 2003-0073578 discloses a passive matrix type organic EL device comprising a first electrode formed on a substrate in a first direction; an organic EL emitting layer formed on the entire surface of the substrate covering the first electrode; and a patterned second electrode positioned over the organic EL emitting layer in a second direction perpendicular to the first direction and by laser induced thermal imaging using a PDMS mold having an uneven portion with recessed regions and protruding regions repeated arranged to satisfy relationships $W/L=0.2-20$ and $D \geq L \times 20$. In the disclosed method, the PDMS mold is attached to the second electrode and thermally cured to separate the second electrode from the protruding region of the mold, thereby completing the patterned second electrode. However, this method is basically the same as the cold-welding method in that the second electrode is separated using a difference in the relative adhesion force between the mold and the second electrode.

SUMMARY OF THE INVENTION

The present invention provides a method for fabricating a patterned organic electroluminescent device using a donor film for thin film transfer, which enables transfer with a small amount of energy due to good adhesion between a transfer layer of the donor film and an acceptor film to be transferred, and allows multiple layers, such as organic small molecular and polymer layers in addition to metal layer, to be simultaneously transferred without using a photothermal conversion layer.

According to an aspect of the present invention, there is provided a method for fabricating an organic electroluminescent device, the method including: forming an anode on a substrate; forming a first organic layer on the anode; preparing a donor film comprising a polymer film patterned in an uneven shape having a protruding region and a recessed region and a transfer layer formed on the polymer film; and forming a patterned layer on the first organic layer by allowing the protruding region of the transfer layer to contact with the first organic layer and applying at least one of heat, light, electricity and pressure to the donor film for transferring the transfer layer to the first organic layer.

According to a further aspect of the present invention, there is provided a method for fabricating a patterned organic electroluminescent device, the method including forming an anode on a substrate, forming an organic layer on the anode, and forming a patterned cathode by allowing a protruding region of a donor film for thin film transfer to contact with the organic layer, the donor film containing a soft polymer film layer patterned in an uneven shape and the metal layer adhered to the patterned polymer film layer, and applying at least one of heat, light, electricity and pressure to the donor film for transferring the metal layer at a time.

According to another aspect of the present invention, there is provided a method for fabricating a patterned organic electroluminescent device, the method including forming an anode on a substrate, forming a first organic layer on the anode, forming a patterned second organic layer on the first organic layer by allowing a protruding region of a donor film for thin film transfer to contact with the first organic layer, the donor film containing a soft polymer film layer patterned in an uneven shape and the second organic layer adhered to the patterned side of the polymer film layer, and applying at least one of heat, light, electricity and pressure to the donor film for transferring the second organic layer, and forming a cathode by depositing a metal layer on the patterned second organic layer.

According to still another aspect of the present invention, there is provided a method for fabricating a patterned organic electroluminescent device, the method including forming an anode on a substrate, forming a first organic layer on the anode, and forming a patterned second organic layer and a cathode on the first organic layer by allowing a protruding region of a donor film for thin film transfer to contact with the first organic layer, the donor film containing a soft polymer film layer patterned in an uneven shape, a metal layer adhered to the patterned side of the polymer film layer, and a second organic layer adhered to the metal layer, and applying at least one of heat, light, electricity and pressure to the donor film for transferring the metal layer and the second organic layer.

According to yet another aspect of the present invention, there is provided a donor film, including a polymer film patterned in an uneven shape having a protruding region and a recessed region and a transfer layer formed on the polymer film.

In a feature of the present invention, the organic layer, the first organic layer, and the second organic layer may include a hole transport layer, a light-emitting layer and an electron transport layer.

In another feature of the present invention, the soft polymer film layer has a glass transition temperature of not greater than room temperature and is any one selected from the group consisting of silicone-based elastomer, polybutadiene, nitrile rubber, acryl rubber, butyl rubber, polyisoprene, and poly(styrene-co-butadiene).

In still another feature of the present invention, the soft polymer film layer further comprises a base film on the opposite side of the patterned side thereof.

According to a further aspect of the present invention, there is provided an organic electroluminescent device fabricated by the above-described method.

According to the present invention, the method of fabricating the organic EL device allows for simultaneous transfer of a metal layer and an organic layer and improved transfer efficiency with a small amount of energy and prevents the organic layer from photo chemical reaction, thus enabling patterned organic EL devices to be easily and efficiently manufactured by a single process.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
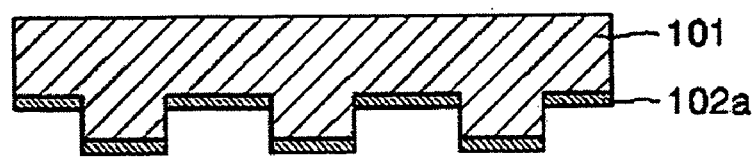
FIGS. 1A and 1B illustrate a method of fabricating an organic EL device according to an embodiment of the present invention, in which heat and pressure are used as energy sources of thin film transfer, respectively.
Figure 1A:
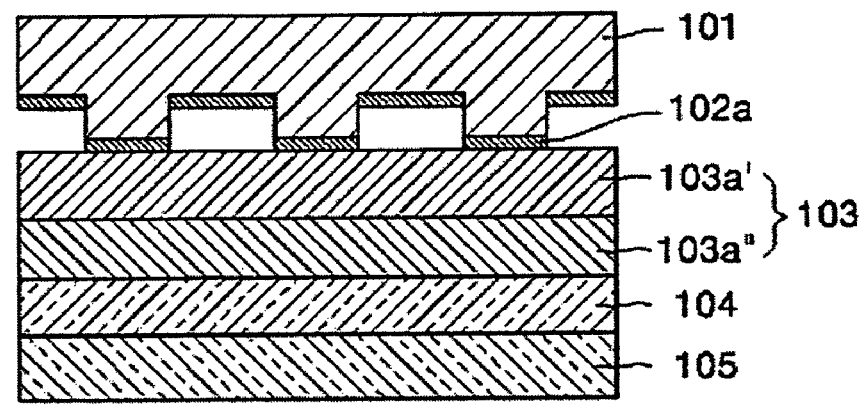
Figure 1A:
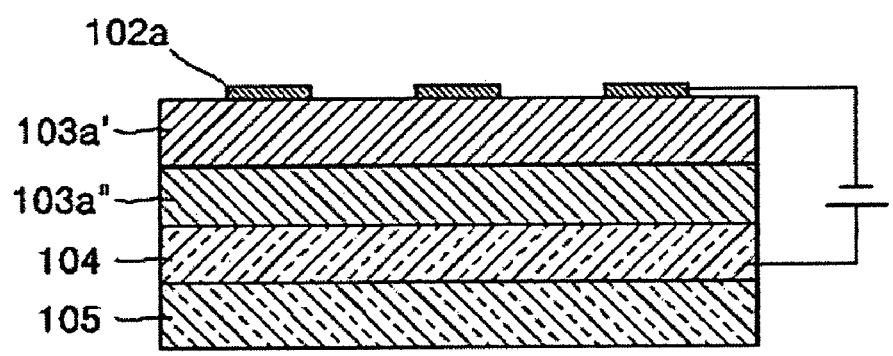

Reference will now be made in detail to the embodiments of the present invention, examples of which are illustrated in the accompanying drawings.

In the method of a patterned organic EL device according to the present invention, a donor film containing a polymer film layer having a glass transition temperature of not greater than room temperature is used for thin film transfer. The polymer film layer is soft, and the polymer film layer preferably has a thickness of 0.5 mm or greater. When the thickness is less than 0.5 mm, the film is too soft to be processed. In addition, the polymer film has a recessed region and a protruding region. Here, a ratio of a width of a protruding region to a width of a recessed region preferably is greater than or equal to 0.1, more preferably greater than or equal to 0.5. When the ratio is less than 0.1, a sagging problem may occur.

The sagging problem refers to a phenomenon in which when the polymer film is adhered to an underlying organic layer, a surface of the recessed region sticks to the underlying organic layer. In addition, a width-to-height ratio of the protruding region is preferably greater than or equal to 0.2, more preferably greater than or equal to 1. When the ratio is less than 0.2, the protruding region cannot bear the pressure applied thereto but collapses.

In other words, after the anode is formed on the substrate, and a portion of the organic layer formed on the anode, the cathode formed on the organic layer, and the portion of the organic layer as well as the cathode, may be patterned, by a donor film for thin film transfer.

The substrate may be formed of glass or plastic.

Here, the donor film for thin film transfer includes a patterned soft polymer film layer which has a glass transition temperature of not greater than room temperature and which is patterned in an uneven pattern, a metal layer and/or an organic layer adhered to the patterned polymer film layer. Unlike a donor film used in the conventional laser induced thermal imaging (LITI), the inventive donor film for thin film transfer does not necessitate a photothermal conversion layer, and enables transfer with a small amount of energy.

The soft polymer film layer having a glass transition temperature of not greater than room temperature has a surface adhered to a layer to be transferred patterned in an uneven shape. Since an upper substrate has a recessed region and a protruding region, patterning is allowed using flood exposure in which energy such as light or heat is applied to the donor film, unlike in the conventional LITI. Therefore, a mass transfer is enabled by a simple process.

The soft polymer film layer has a glass transition temperature of not greater than room temperature and is any one selected from the group consisting of silicone-based elastomer, polybutadiene, nitrile rubber, acryl rubber, butyl rubber, polyisoprene, and poly(styrene-co-butadiene), most preferably polydimethylsiloxane.

Since the polymer forming the polymer film layer has a glass transition temperature of not higher than room temperature, the polymer conformally contacts the underlying organic material layer. Thus, even when much external energy such as heat or light is not applied because of Van der Waals interaction intensively taking place between molecules and atoms, transfer is easily performed due to excellent adhesion force between the polymer film layer and the organic layer to be subjected to transfer.

First, in a case of fabricating a patterned organic EL device by using a donor film for thin film transfer to transfer only a cathode, the method includes forming an anode on a substrate, forming an organic layer on the anode, and forming a patterned cathode by allowing a protruding region of a donor film for thin film transfer to contact with the organic layer, the donor film containing a soft polymer film layer patterned in an uneven shape and the metal layer adhered to the patterned polymer film layer, and applying at least one of heat, light, electricity and pressure to the donor film for transferring the metal layer.

In a case of using light as the energy source, use of a UV lamp allows flood exposure by performing irradiation just once, so that mass transfer is enabled by a simple operation. An irradiation time can be adjusted by intensity of the UV lamp. For example, when the intensity of the UV lamp is 10 mW/cm$^2$, the irradiation time is preferably 5-10 minutes. If it is necessary to perform mass transfer at once within a short time, a photothermal conversion layer can be optionally added.

In a case of using heat as the energy source, transfer is enabled by applying heat at a temperature of about 60 to 80° C. for about 10 to 30 minutes.

In a case of using pressure as the energy source, it is preferred that a base film is further provided on a side opposite to a patterned side of the patterned soft polymer film layer so that a uniform level of pressure is applied throughout the donor film. The base film is any one selected from the group consisting of glass, polyethyleneterephthalate, polycarbonate, polyester, polyethylenenaphthalate, polyestersulfonate, polysulfonate, polyarylate, fluorinated polyimide, fluorinated resin, polyacryl, polyepoxy, polyethylene, polystyrene, polyacetate and polyimide.

In this case, the pressure applied preferably ranges from about 10 kPa to 100 mPa and is applied for 2 to 60 seconds.

In a case of using electricity as the energy source, the electricity applied preferably ranges about 1 mA/cm² to about 10 A/cm², and may be applied for about one minute to about one hour.

The metal layer may be formed of a metal having a work function of about 2.0 eV to about 6.0 eV. The metal layer may have a double-layered structure including a first metal layer and a second metal layer. In a case where the metal layer has a double-layered structure, the first metal layer adhered to the soft polymer film layer preferably has a high work function so that it is unlikely to react with the polymer film layer, and examples thereof include Al, Ag, Au, Pd, Pt, and so on. The second metal layer adhered to the first metal layer is preferably formed of a metal having a low high work function, and examples thereof include Ba, Ca, Mg, Cs, Li, and alloys thereof or alloys of these materials and other metals.

In a case where a layer to be transferred is a metal layer, an adhesion force between the metal and an organic material forming an acceptor film is greater than an adhesion force between the metal and the soft polymer film layer. Thus, the metal layer can be easily separated from the soft polymer film layer by applying even a slight amount of energy thereto.

In other words, when polydimethylsiloxane (PDMS) is used as a soft polymer film, a difference in the adhesion force is related to the work of adhesion W (or interaction energy), and a difference in the work of adhesion can be represented by a surface energy of each layer ($V_1$, $V_2$, $V_3$) and their interfacial energy $Y_{32}$ and $Y_{12}$ where a soft polymer film is denoted by 1, a metal is denoted by 2, and an underlying organic material layer is denoted by 3, as follows:

$$W_{(3-2)} = Y_3 + Y_2 - Y_{32}$$

$$W_{(1-2)} = Y_1 + Y_2 - Y_{12}$$

$$W_{(3-2)} - W_{(1-2)} = (Y_3 - Y_1) - (Y_{32} - Y_{12})$$

The surface energy of the metal $V_2$ is much greater than the surface energy of the underlying organic layer $V_3$ or the surface energy of the polymer film (e.g., PDMS) $V_1$. The difference in the adhesion force is related to a difference in the surface energy between the underlying organic material layer and PDMS. The surface energy of PDMS is 19.8 mJ/m², which is an extremely low level, so that it has a poor adhesion force compared to the underlying organic material layer. When the organic material forming the underlying organic material layer is a light-emitting material such as poly(2-methoxy-5-(2'-ethyl-hexyloxy)-1,4-phenylenevinylene) (MEH-PPV), the surface energy thereof is 28.0 mJ/m². Thus, even if no external energy is applied, transfer readily takes places by prolonging an adhesion time, causing a considerable difference in the adhesion force. In this case, applying external energy, e.g., heat, at 80° C. for 20 minutes or longer can expedite a time for transfer.

An organic layer forming an acceptor film comprises a hole transport layer, a light-emitting layer, and an electron transport layer, and further comprises an electron injection layer, a hole injection layer, an electron blocking layer, and/or a hole blocking layer, when necessary.

Figure 1B:
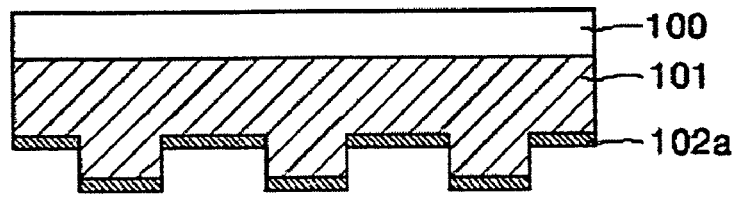
Figure 1B:
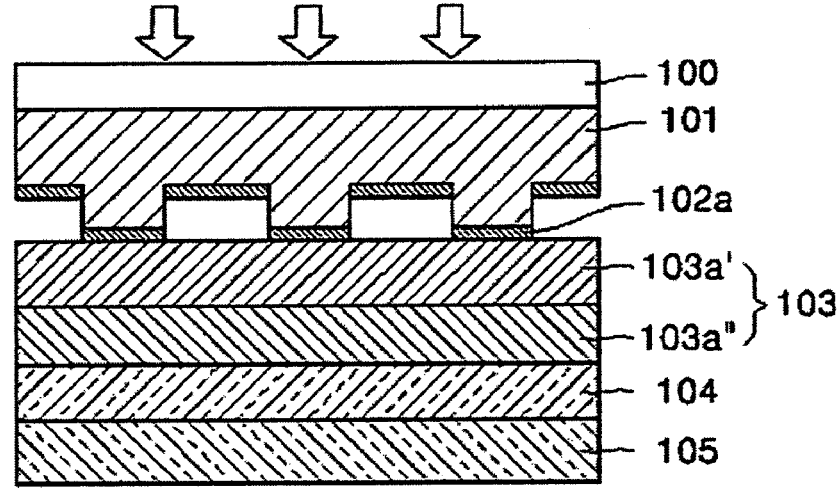
Figure 1B:
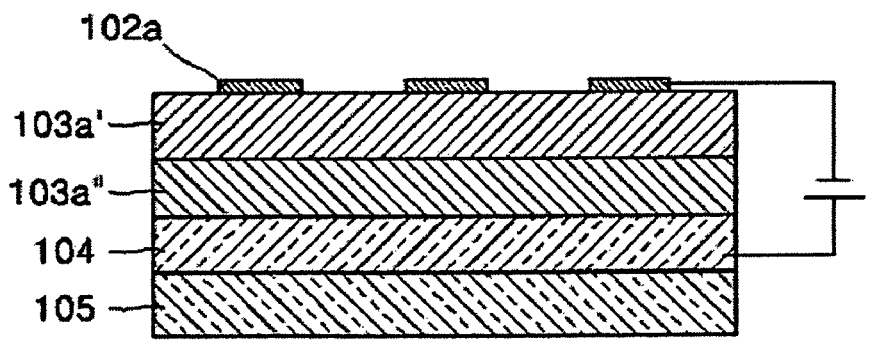

FIGS. 1A and 1B are flow diagrams illustrating methods of fabricating a patterned organic EL device by using a donor film for thin film transfer to transfer a metal layer, which is particularly advantageous in fabricating a passive matrix type organic EL device.

Referring to FIG. 1A, in step (a), a metal layer 102a is deposited on a patterned soft polymer film layer 101 to form a donor film for thin film transfer. In step (b), the donor film for thin film transfer is positioned such that a protruding region of the donor film for thin film transfer comes into contact with an organic layer 103 (which has preferably a first organic layer 103a' and a second organic layer 103a") stacked on an anode 104 disposed on a substrate 105, followed by applying heat thereto. In step (c), the donor film is separated from the resultant structure for thin film transfer, thereby forming the organic layer to which the metal layer 102a is transferred, thereby completing the patterned organic EL device.

FIG. 1B illustrates an example of LITI using pressure as an energy source, in which the same process as in FIG. 1A is performed except that a base film 100 is adhered to the opposite side of the patterned side of the soft polymer film layer 101.

In a case of fabricating a patterned organic EL device by using a donor film for thin film transfer to transfer an organic layer, the method includes forming an anode on a substrate, forming a first organic layer on the anode, forming a patterned second organic layer on the first organic layer by allowing on the first organic layer a protruding region of a donor film for thin film transfer to contact with the first organic layer, the donor film containing a soft polymer film layer patterned in an uneven shape and the second organic layer adhered to the patterned side of the polymer film layer, and applying at least one of heat, light, electricity and pressure to the donor film for transferring the second organic layer at a time, and forming a cathode by depositing a metal layer on the patterned second organic layer.

After the patterned second organic layer is transferred to the first organic layer, the metal layer may be deposited on the second organic layer to form a cathode. Examples of the deposition include thermal deposition, electron beam deposition and sputtering. In this case, the metal layer may also have a single-layered or double-layered structure.

The second organic layer and the first organic layer may include an electron transport layer, a light-emitting layer, and a hole transport layer, and, if necessary, may include an electron injection layer, a hole injection layer, an electron blocking layer, and a hole blocking layer.

Figure 2A:
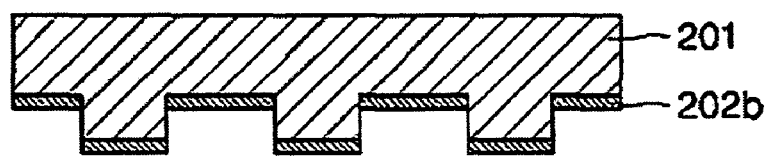
FIGS. 2A and 2B illustrate a method of fabricating an organic EL device according to another embodiment of the present invention, in which heat and pressure are used as energy sources of thin film transfer, respectively.
Figure 2A:
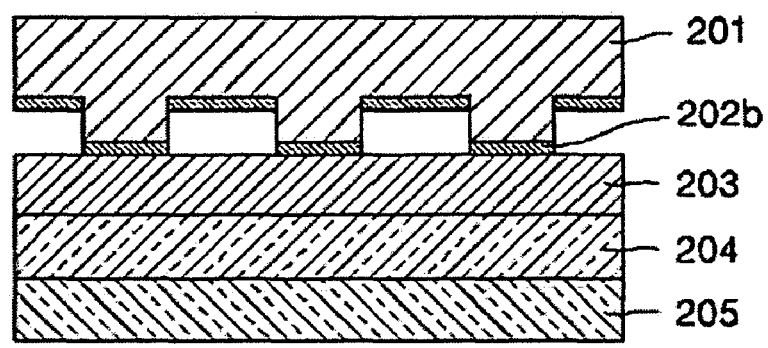
Figure 2A:
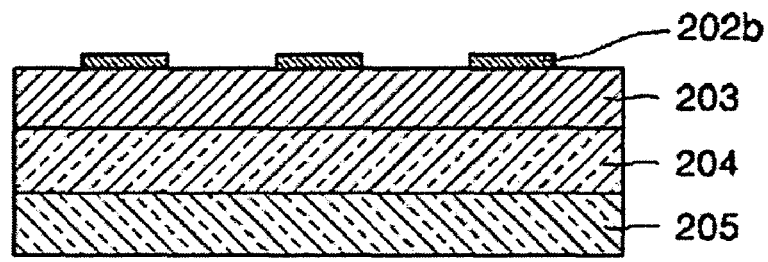
Figure 2A:
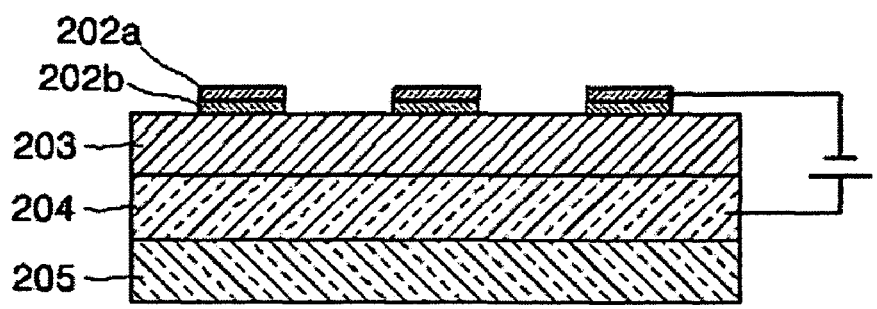
Figure 2B:
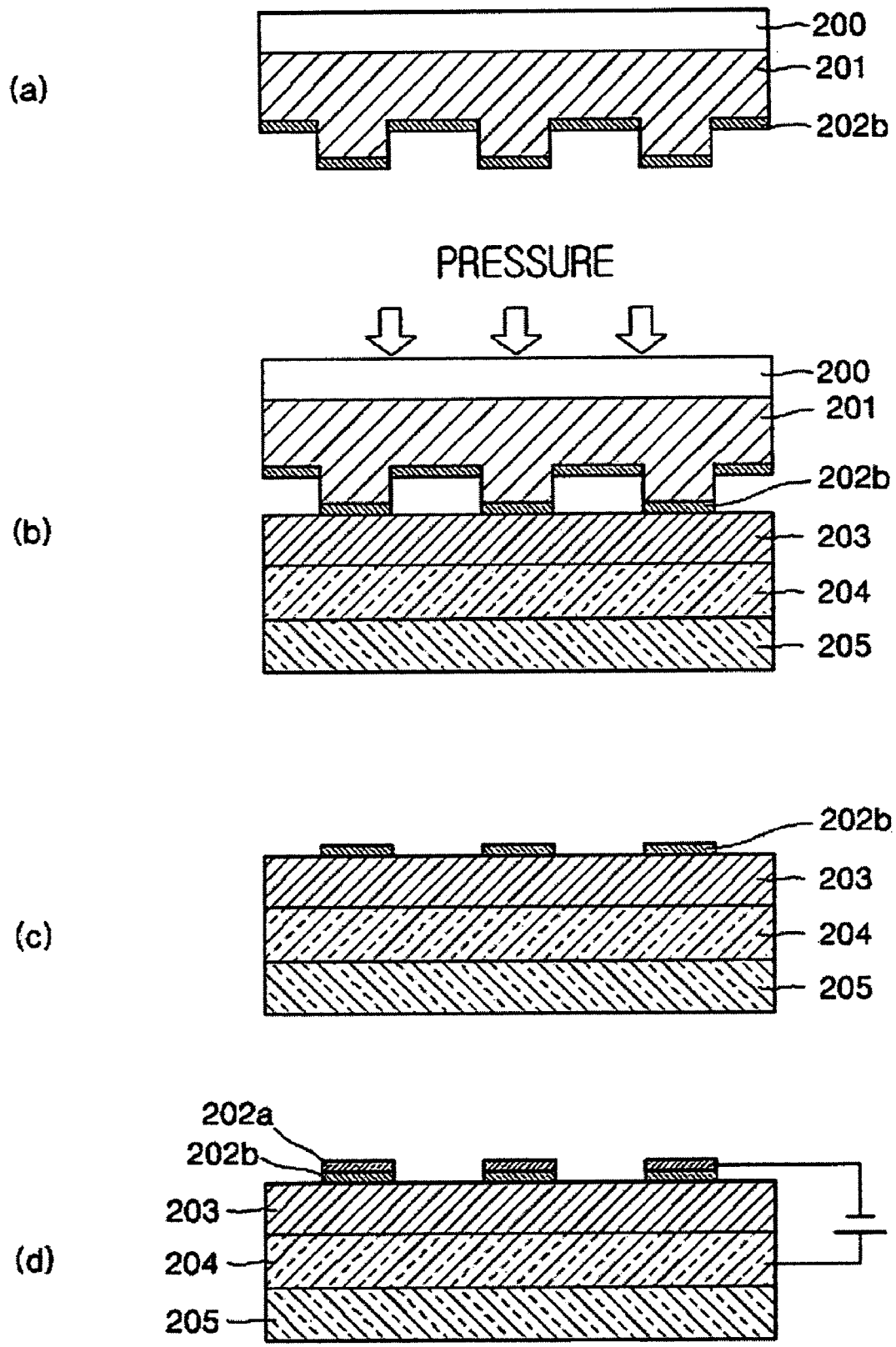

FIGS. 2A and 2B are flow diagrams illustrating methods of fabricating a patterned organic EL device by using a donor film for thin film transfer to transfer an organic layer.

Referring to FIG. 2A, in step (a), a second organic layer 202b is formed on a patterned soft polymer film layer 201 to form a donor film for thin film transfer. In step (b), the donor film for thin film transfer is positioned such that a protruding region of the donor film for thin film transfer comes into contact with a first organic layer 203 stacked on an anode 204 disposed on a substrate 205, followed by applying at least one of heat, light, electricity and pressure thereto. In step (c), the donor film is separated from the resultant structure for thin film transfer, thereby forming a patterned second organic layer 202b. Then, in step (d), a metal layer 202a is deposited on the patterned second organic layer 202*b* to form a cathode, thereby completing the patterned organic EL device.

FIG. 2B illustrates an example of thin film transfer using pressure as an energy source, in which the same process as in FIG. 2A is performed except that a base film 200 is adhered to the opposite side of the patterned side of the soft polymer film layer 201.

In a case of fabricating a patterned organic EL device using both a metal layer and an organic layer as a donor film for thin film transfer, the method includes forming an anode on a substrate, forming a first organic layer on the anode and forming a patterned second organic layer and a cathode on the first organic layer by allowing a protruding region of a donor film for thin film transfer to contact with the first organic layer, the donor film containing a soft polymer film layer patterned in an uneven shape, a metal layer adhered to the patterned side of the polymer film layer, and a second organic layer adhered to the metal layer, and applying at least one of heat, light, electricity and pressure to the donor film for transferring the metal layer and the second organic layer at a time.

Figure 3:
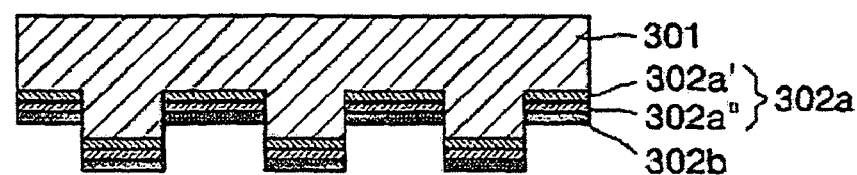
FIG. 3 illustrates a method of fabricating an organic EL device according to still another embodiment of the present invention.
Figure 3:
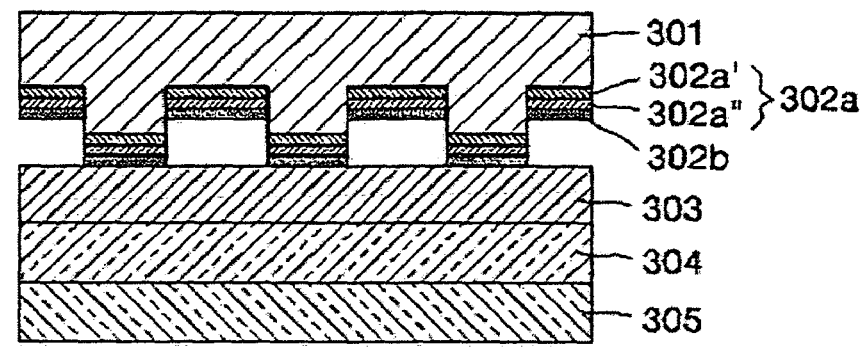
Figure 3:
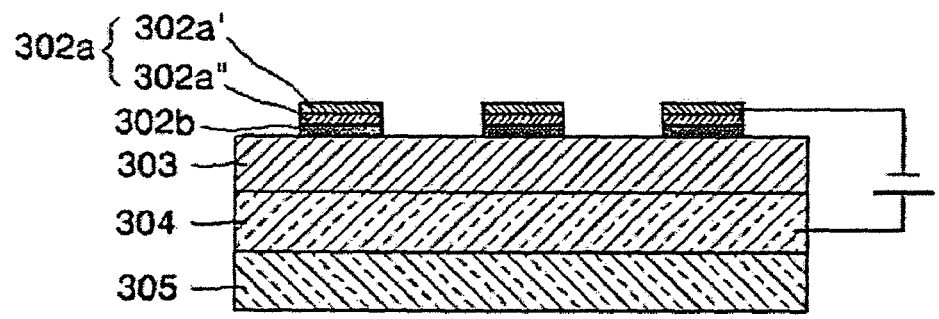

FIG. 3 is a flow diagram illustrating a method of fabricating a patterned organic EL device by using a donor film for thin film transfer to transfer a metal layer and a second organic layer.

Referring to FIG. 3, in step (a), a metal layer 302*a* which has a first metal layer 302*a'* and a second metal layer 302*a"*, and a second organic layer 302*b* are sequentially formed on a patterned soft polymer film layer 301 to form a donor film for thin film transfer. In step (b), the donor film for thin film transfer is positioned such that a protruding region of the donor film for thin film transfer comes into contact with a first organic layer 303 stacked on an anode 304 disposed on a substrate 305, followed by applying at least one of heat, light, electricity and pressure thereto. In step (c), the donor film is separated from the resultant structure for thin film transfer along with the metal layer 302*a* and the second organic layer 302*b*, thereby completing the patterned organic EL device.

The second organic layer in the donor film and the first organic layer where thin film transfer is performed may include an electron transport layer, a light-emitting layer, and a hole transport layer, and, if necessary, may include an electron injection layer, a hole injection layer, an electron blocking layer, and a hole blocking layer.

The donor film for thin film transfer employed in the method of the present invention is formed by forming a soft polymer film layer having a glass transition temperature of not greater than room temperature, and forming a metal layer or a second organic layer or a metal layer and a second organic layer on the polymer film layer.

In a case where the soft polymer film layer further includes a base film, the metal layer or the second organic layer or both the metal layer and the second organic layer are deposited on one side of the polymer film layer, followed by attaching the base film to the opposite side of the polymer film layer.

The patterned soft polymer film layer may be prepared by the following method. First, a master made of a wafer is prepared. The master has a predetermined uneven pattern. Then, a precursor solution for forming the soft polymer film is formed. The precursor solution is readily available from many manufacturers. For example, polydimethylsiloxane (PDMS) is commercially available from Dow Chemical Inc. in the trade name of Sylgard 184 series. The precursor solution for forming the soft polymer film is poured into the master and cured at an appropriate temperature for a predetermined period of time, e.g., at room temperature to about 100° C. for about 1-24 hours, preferably at about 60 to about 80° C. for about 1-3 hours, in a case of using PDMS as the precursor solution for forming the soft polymer film, thereby forming the patterned polymer film layer. Finally, the patterned polymer film layer is separated from the master.

Next, a metal layer or a second organic layer is deposited or coated on the entire surface of the thus-formed patterned polymer film layer. In the depositing of the metal layer or second organic layer, in order to avoid deposition of lateral surfaces of the layer, vertical deposition is employed. Examples of the deposition include, but not limited to, sputtering, e-beam deposition, thermal deposition, and so on.

In the organic EL device according to the present invention, the anode is at least one selected from the group consisting of ITO (Indium tin oxide), IZO (indium zinc oxide), ITZO (indium tin zinc oxide), Au, Ag, Al, polythiophene, polypyrrole and polyaniline derivatives.

In the organic EL device according to the present invention, the cathode may be formed by a single-layer or double-layer structure made of a metal having a work function of 2.0 to 6.0 eV.

In the organic layer of the organic EL device according to the present invention, the hole injection layer may be formed of a conductive polymer such as PEDOT (poly-3,4-ethylenedioxythiophene), polypyrrole, or polyaniline, or an organic material having an HOMO value in the range of 4.5-6.0 eV, and the light-emitting layer may be formed of a polymer material exemplified by polyfluorene, spirofluorene, polyphenylene, polyphenylene vinylene, polythiophene, polysulfone, polyquinoline, polyquinoxaline, polyphenoxazine, polythiazine, or a derivative thereof, or a small molecular material having a molecular weight of not greater than 10000. The hole transport layer may be formed of an organic small molecular material or polymer material having a hole transporting function, such as carbazole or arylamine. The electron transport layer may be formed of an organic small molecular material or polymer material having an electron transporting function, such as quinoline, quinoxaline, or a metallic complex fluorescent material. The electron injection layer may be formed of metallic halide, or metallic oxide.

Hereinafter, preferred examples are given to better understand the present invention.

EXAMPLES

Example 1

Preparation of Donor Film for Thin Film Layer

Transfer Layer: Metal Layer Only

Sylgard 184A and Sylgard 184B (manufactured from Dow Corning Inc.) were mixed in a stirring vessel in a weight ratio of 10:1 to give a PDMS forming solution. The resulting PDMS forming solution was poured into a master formed of a separately prepared wafer. The master has a striped pattern. Bubbles in the PDMS forming solution poured into the master were removed using a vacuum pump, followed by curing the PDMS forming solution in an oven at a temperature ranging from about 60° C. to about 80° C. and removing the master from the resultant structure, thereby obtaining a PDMS film layer.

Au was deposited on a patterned surface of the obtained PDMS film layer to a thickness of 20 nm by electron beam deposition under vacuum of $1 \times 10^{-7}$ torr.

Fabrication of Patterned Organic EL Device

A glass substrate and 15 $\Omega/cm^2$ (1200 Å) ITO as a first electrode cut into a size of 50 mm×50 mm×0.7 mm were subjected to ultrasonic cleaning in isopropyl alcohol and distilled water for 5 minutes, respectively, followed by subjecting to UV-$O_3$ treatment for 30 minutes. A hole transport material (poly(9,9-dioctylfluorene-co-bis-N,N',(4-butylphenyl)-bis-N,N'-phenyl-1,4-phenylenediamine (PFB) manufactured by Dow Chemical Co.) was spin coated on the ITO electrode, thus forming a hole transport layer having a thickness of 10 nm. A spirofluorene-based light-emitting polymer as a blue emitting material was coated on the hole transport layer to form a 70 nm thick light-emitting layer, and an electron transport layer made of alumina quinine ($Alq_3$) was deposited on the light-emitting layer to a thickness of 30 nm. Then, a protruding region of the donor film was allowed to contact with the electron transport layer and subjected to thin film transfer by performing IR lamp irradiation for 10 minutes to form a patterned cathode, thus completing an organic EL device.

Example 2

Preparation of Donor Film for Thin Film Transfer

Transfer Layer: Organic Layer Only

Sylgard 184A and Sylgard 184B (manufactured from Dow Corning Inc.) were mixed in a stirring vessel in a weight ratio of 10:1 to give a PDMS forming solution. The resulting PDMS forming solution was poured into a master formed of a separately prepared wafer. The master has a striped pattern. Bubbles in the PDMS forming solution poured into the master were removed using a vacuum pump, followed by curing the PDMS forming solution in an oven at a temperature ranging from about 60° C. to about 80° C. and removing the master from the resultant structure, thereby obtaining a PDMS film layer.

Alumina quinine ($Alq_3$) was deposited on a patterned surface of the obtained PDMS film layer to a thickness of 30 nm under vacuum of $1\times10^{-7}$ torr to be used as a second organic layer forming an electron transport layer.

Fabrication of Patterned Organic EL Device

A glass substrate and 15 $\Omega/cm^2$ (1200 Å) ITO as a first electrode cut into a size of 50 mm×50 mm×0.7 mm were subjected to ultrasonic cleaning in isopropyl alcohol and distilled water for 5 minutes, respectively, followed by subjecting to UV-$O_3$ treatment for 30 minutes. A hole transport material (poly(9,9-dioctylfluorene-co-bis-N,N',(4-butylphenyl)-bis-N,N'-phenyl-1,4-phenylenediamine (PFB) manufactured by Dow Chemical Co.) was spin coated on the ITO electrode, thus forming a hole transport layer having a thickness of 10 nm. A spirofluorene-based light-emitting polymer as a blue emitting material was coated on the hole transport layer to form a 70 nm thick light-emitting layer. Then, a protruding region of the donor film was allowed to contact with the light-emitting layer and subjected to thin film transfer by performing IR lamp irradiation for 10 minutes to form a patterned electron transport layer. Ca and Al metals were deposited on the patterned electron transport layer to thicknesses of 5 nm and 250 nm to form a cathode, thus completing an organic EL device.

Example 3

Preparation of Donor Film for LITI

Transfer Layer: Metal Layer and Organic Layer

Sylgard 184A and Sylgard 184B (manufactured from Dow Corning Inc.) were mixed in a stirring vessel in a weight ratio of 10:1 to give a PDMS forming solution. The resulting PDMS forming solution was poured into a master formed of a separately prepared wafer. The master has a striped pattern. Bubbles in the PDMS forming solution poured into the master were removed using a vacuum pump, followed by curing the PDMS forming solution in an oven at a temperature ranging from about 60° C. to about 80° C. and removing the master from the resultant structure, thereby obtaining a PDMS film layer.

Au was deposited on a patterned surface of the obtained PDMS film layer to a thickness of 20 nm by electron beam deposition, Ca was deposited thereon to a thickness of 5 nm by thermal deposition, and a second organic layer made of alumina quinine ($Alq_3$) as a potential electron transport layer was deposited on the metal layer to a thickness of 5 nm under vacuum of $1\times10^{-7}$ torr.

(1) Fabrication of Patterned Organic EL Device (Energy Source: Light)

A glass substrate and 15 $\Omega/cm^2$ (1200 Å) ITO as a first electrode cut into a size of 50 mm×50 mm×0.7 mm were subjected to ultrasonic cleaning in isopropyl alcohol and distilled water for 5 minutes, respectively, followed by subjecting to UV-$O_3$ treatment for 30 minutes. A hole transport material (poly(9,9-dioctylfluorene-co-bis-N,N',(4-butylphenyl)-bis-N,N'-phenyl-1,4-phenylenediamine (PFB) manufactured by Dow Chemical Co.) was spin coated on the ITO electrode, thus forming a hole transport layer having a thickness of 10 nm. A spirofluorene-based light-emitting polymer as a blue emitting material was coated on the hole transport layer to form a 70 nm thick light-emitting layer. Then, a protruding region of the donor film was allowed to contact with the light-emitting layer and subjected to thin film transfer by performing IR lamp irradiation for 10 minutes to form patterned cathode and an electron transport layer, thus completing an organic EL device.

(2) Fabrication of Patterned Organic EL Device (Energy Source: Electricity)

A glass substrate and 15 $\Omega/cm^2$ (1200 Å) ITO as a first electrode cut into a size of 50 mm×50 mm×0.7 mm were subjected to ultrasonic cleaning in isopropyl alcohol and distilled water for 5 minutes, respectively, followed by subjecting to UV-$O_3$ treatment for 30 minutes. A hole transport material (poly(9,9-dioctylfluorene-co-bis-N,N',(4-butylphenyl)-bis-N,N'-phenyl-1,4-phenylenediamine (PFB) manufactured by Dow Chemical Co.) was spin coated on the ITO electrode, thus forming a hole transport layer having a thickness of 10 nm. A spirofluorene-based light-emitting polymer as a blue emitting material was coated on the hole transport layer to form a 70 nm thick light-emitting layer. Then, a protruding region of the donor film was allowed to contact with the light-emitting layer and subjected to thin film transfer by applying current of 1 $A/cm^2$ to grounded anode and cathode for 30 minutes, to form a patterned cathode and an electron transport layer, thus completing an organic EL device.

(3) Fabrication of Patterned Organic EL Device (Energy Source: Pressure)

A glass substrate and 15 Ω/cm² (1200 Å) ITO as a first electrode cut into a size of 50 mm×50 mm×0.7 mm were subjected to ultrasonic cleaning in isopropyl alcohol and distilled water for 5 minutes, respectively, followed by subjecting to UV-O₃ treatment for 30 minutes. A hole transport material (poly(9,9-dioctylfluorene-co-bis-N,N',(4-butylphenyl)-bis-N,N'-phenyl-1,4-phenylenediamine (PFB) manufactured by Dow Chemical Co.) was spin coated on the ITO electrode, thus forming a hole transport layer having a thickness of 10 nm. A spirofluorene-based light-emitting polymer as a blue emitting material was coated on the hole transport layer to form a 70 nm thick light-emitting layer. Then, the donor film is attached to a glass support, a protruding region of the donor film was allowed to contact with the light-emitting layer and subjected to thin film transfer by applying pressure of 150 kPa to the donor film for 15 seconds to form a patterned cathode and an electron transport layer, thus completing an organic EL device.

Comparative Example 1

Fabrication of Patterned Organic EL Device

A glass substrate and 15 Ω/cm² (1200 Å) ITO as a first electrode cut into a size of 50 mm×50 mm×0.7 mm were subjected to ultrasonic cleaning in isopropyl alcohol and distilled water for 5 minutes, respectively, followed by subjecting to UV-O₃ treatment for 30 minutes. A hole transport material (poly(9,9-dioctylfluorene-co-bis-N,N',(4-butylphenyl)-bis-N,N'-phenyl-1,4-phenylenediamine (PFB) manufactured by Dow Chemical Co.) was spin coated on the ITO electrode, thus forming a hole transport layer having a thickness of 10 nm. A spirofluorene-based light-emitting polymer as a blue emitting material was coated on the hole transport layer to form a 70 nm thick light-emitting layer. Then, an electron transport layer made of alumina quinine ($Alq_3$) was deposited on the light-emitting layer to a thickness of 30 nm. Au was deposited on the obtained film layer to a thickness of 20 nm by thermal deposition under vacuum of $1\times10^{-7}$ torr.

Evaluation Test 1

Figure 4:
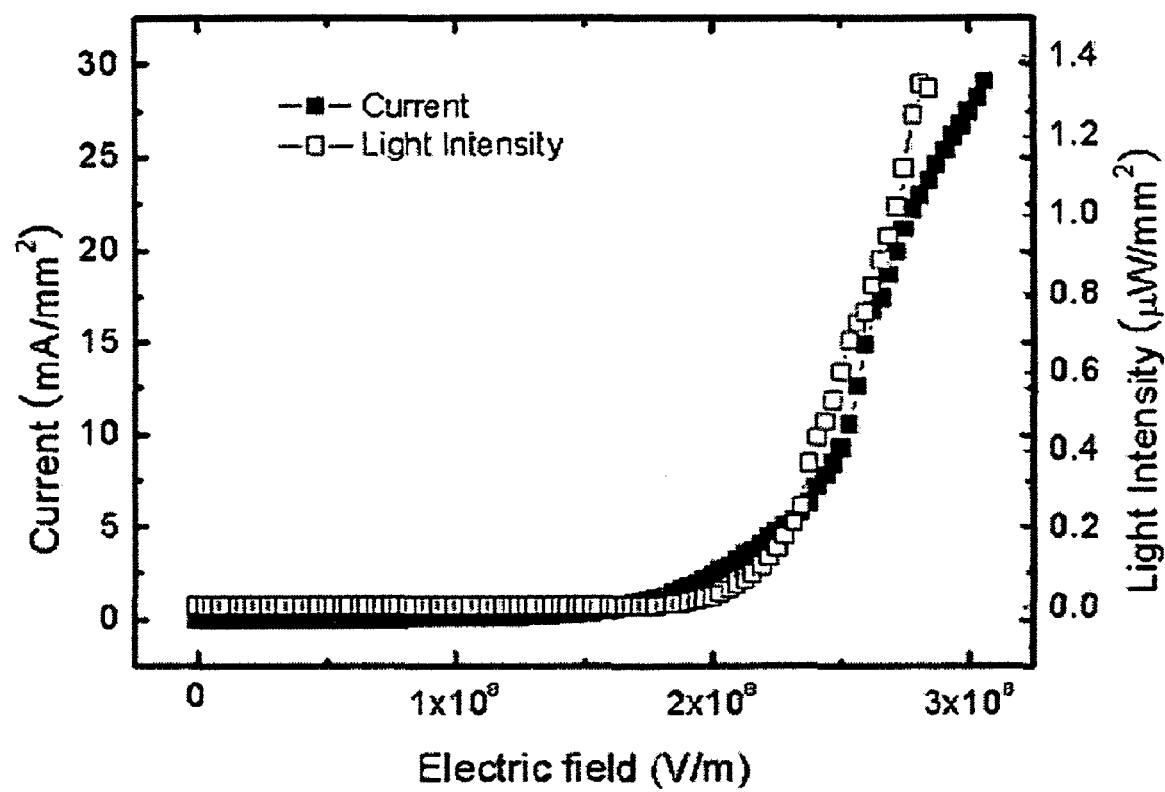
FIG. 4 illustrates the current and light intensity of the organic EL device according to the present invention.

To test performance of the organic EL device according to the present invention, currents and emission intensities of the organic EL device fabricated in Example 1 were measured and results thereof are shown in FIG. 4.

Referring to FIG. 4, it can be seen that the electric field versus current and light intensity characteristics exhibited by the organic EL device fabricated according to the present invention are substantially the same as diode characteristics, suggesting that the organic EL device fabricated according to the present invention has good manufacturability.

Evaluation Test 2

To test performance of the organic EL device according to the present invention, the efficiency (Luminance/Current) of the organic EL device fabricated in Example 1 was measured using Minolta CS1000 and Keithley 236. For comparison, the efficiency of the organic EL device fabricated in Comparative Example 1 was also measured. The measurement results were 0.05 cd/A and 0.01 cd/A, respectively. It is understood that the method of fabricating the organic EL device according to the present invention is improved compared to a method of fabricating the organic EL device according to Comparative Example 1.

According to the present invention, the method of fabricating the organic EL device allows for improved transfer efficiency with a small amount of energy, thus enabling patterned organic EL devices to be easily and efficiently manufactured by a single process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for fabricating an organic electroluminescent device, the method comprising:
   forming an anode on a substrate;
   forming a first organic layer on the anode;
   preparing a donor film comprising a polymer film patterned in an uneven shape having a protruding region and a recessed region and a transfer layer formed on the polymer film; and
   forming a patterned layer on the first organic layer by allowing the protruding region of the transfer layer to contact with the first organic layer and applying at least one of heat, light, electricity and pressure to the donor film for transferring the transfer layer onto the first organic layer.

2. The method of claim 1, wherein the transfer layer comprises a first metal layer, and the patterned layer is a cathode.

3. The method of claim 1, wherein the transfer layer comprises a second organic layer.

4. The method of claim 1, wherein the transfer layer comprises a first metal layer formed on the polymer film and a second organic layer formed on the first metal layer, and the patterned layer comprises a cathode and the second organic layer.

5. The method of claim 1, wherein the polymer film has a thickness of 0.5 mm or greater.

6. The method of claim 1, wherein a ratio of a width of a protruding region to a width of a recessed region of the donor film is greater than or equal to 0.1.

7. The method of claim 1, wherein a width-to-height ratio of the protruding region of the donor film is greater than or equal to 0.2.

8. The method of claim 2, wherein the first organic layer includes a hole transport layer, a light-emitting layer and an electron transport layer.

9. The method of claim 2, wherein the first metal layer comprises at least one metal layer having a work function in a range of 2.0 eV to 6.0 eV.

10. The method of claim 1, wherein the polymer film has a glass transition temperature of not greater than room temperature.

11. The method of claim 1, wherein the polymer film is at least one selected from the group consisting of silicone-based elastomer, polybutadiene, nitrile rubber, acryl rubber, butyl rubber, polyisoprene, and poly(styrene-co-butadiene).

12. The method of claim 11, wherein the silicone-based elastomer is polydimethylsiloxane.

13. The method of claim 1, wherein the donor film further comprises a base film formed on the polymer film in the opposite direction of the transfer layer.

14. The method of claim 13, wherein the base film is at least one selected from the group consisting of glass, polyethyleneterephthalate, polycarbonate, polyester, polyethylenenaphthalate, polyestersulfonate, polysulfonate, polyarylate, fluorinated polyimide, fluorinated resin, polyacryl, polyepoxy, polyethylene, polystyrene, polyacetate and polyimide.

15. The method of claim 3, wherein the first and second organic layers include a hole transport layer, a light-emitting layer and an electron transport layer.

16. The method of claim 4, wherein the first and second organic layers include a hole transport layer, a light-emitting layer and an electron transport layer.

17. A method for fabricating an organic electroluminescent device, the method comprising:
  forming an anode on a substrate;
  forming a first organic layer on the anode; and
  preparing a donor film comprising a polymer film patterned in an uneven shape having a protruding region and a recessed region and a transfer layer formed on the polymer film, the polymer film having a thickness of 0.5 mm or greater, a ratio of a width of a protruding region to a width of a recessed region being greater than or equal to 0.1, a width-to-height ratio of the protruding region being greater than or equal to 0.2; and
  forming a patterned layer on the first organic layer by allowing the protruding region of the transfer layer to contact with the first organic layer and applying at least one of heat, light, electricity and pressure to the donor film for transferring the transfer layer onto the first organic layer.

18. A donor film, comprising:
  a polymer film patterned in an uneven shape having a protruding region and a recessed region; and
  a transfer layer formed on the polymer film.

19. The donor film of claim 18, wherein the transfer layer comprises at least one of a metal layer and an organic layer.

20. The donor film of claim 18, wherein the polymer film has a thickness of 0.5 mm or greater, a ratio of a width of a protruding region to a width of a recessed region is greater than or equal to 0.1, and a width-to-height ratio of the protruding region is greater than or equal to 0.2.

21. The donor film of claim 18, wherein the polymer film has a glass transition temperature of not greater than room temperature.

22. A method for fabricating an organic electroluminescent device, the method comprising utilizing the donor film of claim 18.

* * * * *